United States Patent
Gregory

(10) Patent No.: US 7,288,739 B2
(45) Date of Patent: *Oct. 30, 2007

(54) METHOD OF FORMING AN OPENING OR CAVITY IN A SUBSTRATE FOR RECEIVING AN ELECTRONIC COMPONENT

(75) Inventor: John Gregory, Atlanta, GA (US)

(73) Assignee: STS ATL Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/070,558

(22) Filed: Mar. 2, 2005

(65) Prior Publication Data

US 2005/0145608 A1 Jul. 7, 2005

Related U.S. Application Data

(63) Continuation of application No. 10/204,154, filed as application No. PCT/IB01/00555 on Feb. 2, 2001, now Pat. No. 6,956,182.

(51) Int. Cl.
*B23K 26/00* (2006.01)
*H01L 27/00* (2006.01)

(52) U.S. Cl. .................................. 219/121.69; 29/835

(58) Field of Classification Search ................ 438/106, 438/111, 112, 125; 257/700; 361/761, 762, 361/764, 776; 439/77; 219/121.68, 121.69; 29/835; 174/261

See application file for complete search history.

(56) References Cited

U.S. PATENT DOCUMENTS

| | | | |
|---|---|---|---|
| 3,582,865 A * | 6/1971 | Franck et al. ................. | 439/67 |
| 3,689,991 A * | 9/1972 | Aird ............................. | 29/827 |
| 5,025,114 A | 6/1991 | Braden | |
| 5,359,496 A | 10/1994 | Kornrumpf et al. | |
| 5,600,541 A * | 2/1997 | Bone et al. .................. | 361/707 |
| 5,764,484 A | 6/1998 | Hoffman et al. | |
| 5,800,575 A * | 9/1998 | Lucas ......................... | 29/25.42 |
| 5,837,154 A | 11/1998 | Okabe et al. | |
| 5,998,862 A * | 12/1999 | Yamanaka ................... | 257/704 |
| 6,281,090 B1 * | 8/2001 | Kukanskis et al. .......... | 438/382 |
| 6,445,591 B1 * | 9/2002 | Kwong ........................ | 361/761 |
| 6,459,593 B1 * | 10/2002 | Kwong ........................ | 361/761 |
| 6,469,313 B2 * | 10/2002 | Kim et al. ..................... | 257/10 |
| 6,487,083 B1 * | 11/2002 | Kwong ........................ | 361/761 |
| 6,515,356 B1 * | 2/2003 | Shin et al. ................... | 257/678 |
| 6,528,733 B2 * | 3/2003 | Takenaka et al. ............ | 174/255 |

(Continued)

FOREIGN PATENT DOCUMENTS

DE 36 08 410 A1 3/1986

(Continued)

*Primary Examiner*—Samuel M. Heinrich
(74) *Attorney, Agent, or Firm*—Paul D. Bianco; Martin Fleit; Fleit Kain Gibbons Gutman Bongini & Bianco P.L.

(57) ABSTRACT

A method of forming an opening or cavity in a substrate, for receiving an electronic component, consists of or includes providing a patterned opaque masking layer on or adjacent a first major surface of the substrate, the masking layer having an opening overlying the position where the cavity is to be made, removing material from the substrate by laser ablation through the opening thereby forming an opening or cavity of a suitable size for receiving said electronic component.

37 Claims, 4 Drawing Sheets

U.S. PATENT DOCUMENTS

| | | | |
|---|---|---|---|
| 6,732,428 B1 * | 5/2004 | Kwong | 29/832 |
| 2002/0053736 A1 * | 5/2002 | Corisis | 257/730 |
| 2003/0066679 A1 * | 4/2003 | Castro et al. | 174/255 |
| 2007/0099449 A1 * | 5/2007 | Suzuki et al. | 439/74 |

FOREIGN PATENT DOCUMENTS

| | | |
|---|---|---|
| DE | 43 26 424 A1 | 2/1995 |
| DE | 198 24 225 A1 | 5/1998 |
| EP | 0 706 309 A1 | 4/1996 |
| GB | 2 286 787 A | 8/1995 |
| JP | 354071986 A * | 6/1979 |
| JP | 360007730 A * | 1/1985 |
| JP | 411097491 A * | 4/1999 |

* cited by examiner

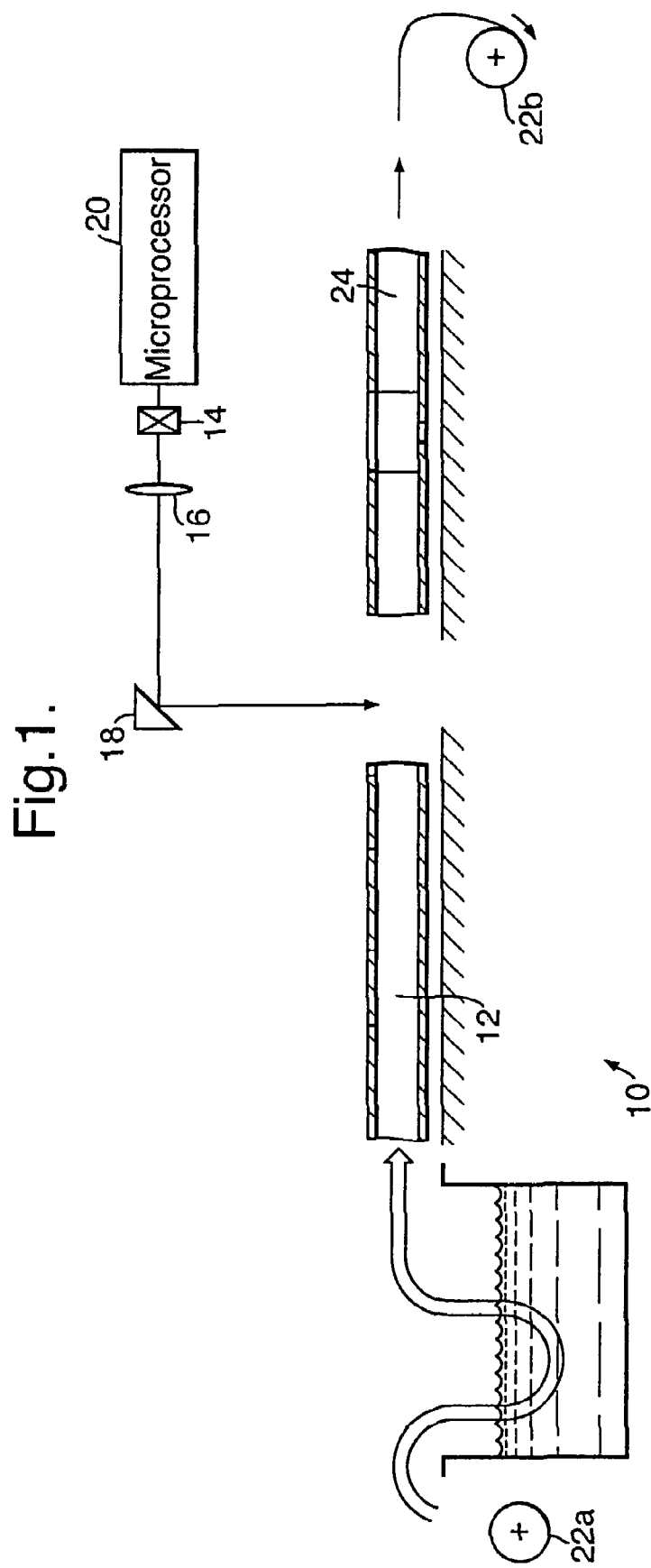

Fig.4.
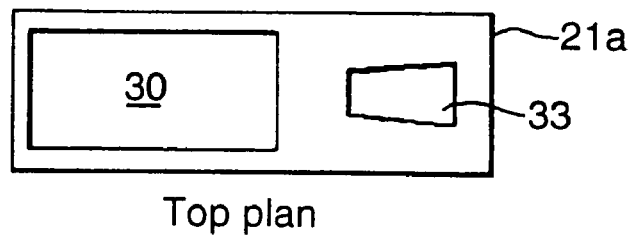
Top plan
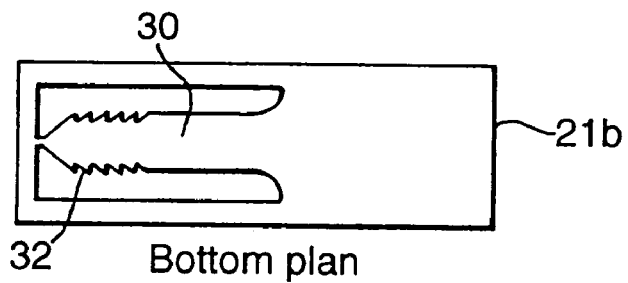
Bottom plan
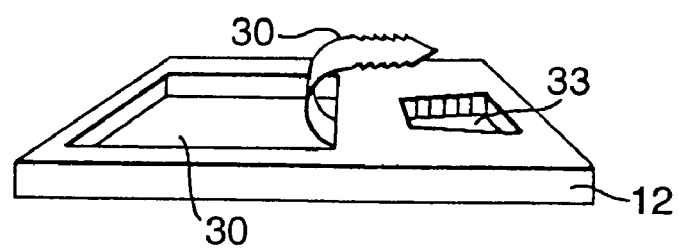
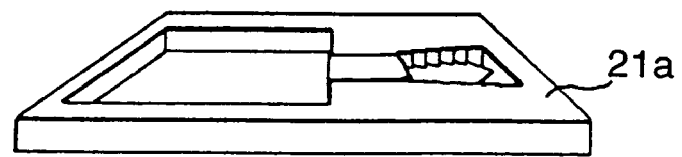

METHOD OF FORMING AN OPENING OR CAVITY IN A SUBSTRATE FOR RECEIVING AN ELECTRONIC COMPONENT

CROSS-REFERENCE TO RELATED APPLICATION

This application is a continuation of U.S. patent application Ser. No. 10/204,154, filed Mar. 24, 2003, now U.S. Pat. No. 6,956,182 which is here incorporated by reference in its entirety.

BACKGROUND OF THE INVENTION

This invention relates to a method of forming an opening or cavity in a substrate. The substrate is preferably of the type which can include an electronic component or integrated circuit. An example of such a substrate is a printed circuit board (PCB).

As circuit density of electronic components, particularly integrated circuits, has increased, there has been a corresponding increase in the problems associated with connecting them to connections and conductors on printed circuit boards (PCB). This problem is particularly severe when there are a large number of interconnects, (for example in the case of micro-processor devices).

PRIOR ART

Known soldering and wire bonding techniques are expensive and require cumbersome equipment in order to achieve efficiency in the fabrication process. Additionally there may be a requirement to heat the solder twice; firstly on preparation of the PCB and again when mounting components on the PCB The technique of forming an opening in a substrate for an electronic component is well known, see for example U.S. Pat. No. 3,480,836, which discloses pre-punching holes in a substrate, after which conductor leads having tabs which project over the cavity are attached. This technique has been further developed, for example in U.S. Pat. No. 4,927,491 in which the substrate is a flexible tape.

JP 10098081 discloses using a carbon gas laser to cut a perimeter trench for an opening in a substrate having a copper foil laminated on both sides, the remaining substrate material being removed in a second step. The copper foil is then patterned by lithography and etching to form leads to retain a component.

SUMMARY OF THE INVENTION

The present invention arose in order to provide smaller interconnect dimensions on a PCB, thereby rendering it capable of being produced thinner and eliminating the need for synthetic plastics leaded chip carriers (PLCCs). The present invention can also be used to manufacture chip carriers with beneficial properties and lower cost.

According to a first aspect of the present invention there is provided a method as specified in claims 1-8. According to a second aspect of the invention there is provided a substrate as specified in claim 9. According to a further aspect the invention provides a device as specified in claim 10.

Embodiments of the invention will now be described, by way of example only, with reference to the accompanying schematic Figures in which:

BRIEF DESCRIPTION OF THE DRAWINGS

FIG. 1 shows a diagrammatic view of an embodiment of an apparatus for forming interconnects on a substrate;

FIG. 4 shows a method of forming a contact through a via hole.

DETAILED DESCRIPTION OF CERTAIN ADVANTAGEOUS EMBODIMENTS

Figure 2A:
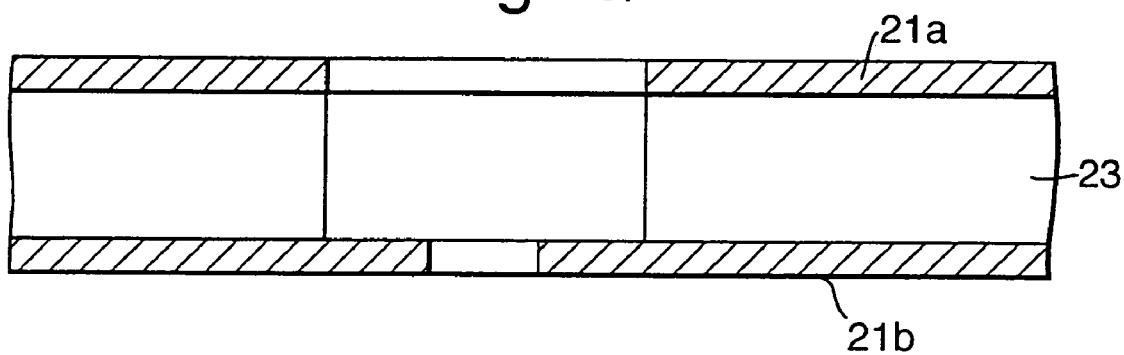
FIGS. 2a and 2b are diagrammatic sectional and plan views of a single component mounted on the substrate produced using the apparatus of FIG. 1.

FIG. 1 is an overall view of an apparatus 10 for forming interconnects on a substrate 12. The apparatus 10 includes a laser 14, focussed through a suitable lens system 16, which in use, reflects off mirror 18. In the present embodiment a $CO_2$ laser having a power of 50-500 Watts and a beam diameter of 480 microns is used. However, higher powers and larger diameters are desirable for increasing throughput. An Excimer laser or YAG laser can be used as an alternative.

So as to be able to fully appreciate the apparatus it is necessary to consider the apparatus in association with other equipment. These include means for delivering the substrate, such as a flat bed table 24. Means for selectively removing regions from a first layer of material. This may include a photo imager (not shown) and an etch bath (not shown). Means for removing volumes of the substrate may be a laser 14 or an ion beam etching device (not shown) or a plasma etcher (not shown). Means for removing the material from the second surface, may be a modified etch bath capable of etching an electrical conductor. These in conjunction with the apparatus are controlled by a series of micro-processors (not shown).

Power output of the laser 14 is controlled by microprocessor 20. As well as controlling the pulse duration and energy of the laser 14, micro-processor 20 orientates mirror 18 and may also be used to focus the laser 14 via the lens system 16.

A different depth cavity can be formed either by pulsing a larger number of pulses from the energy source or increasing the duration of each pulse. Similarly an array of cavities can be fabricated, the number and size of cavities in the array can be varied to produce different products or accommodate different devices.

Figure 2B:
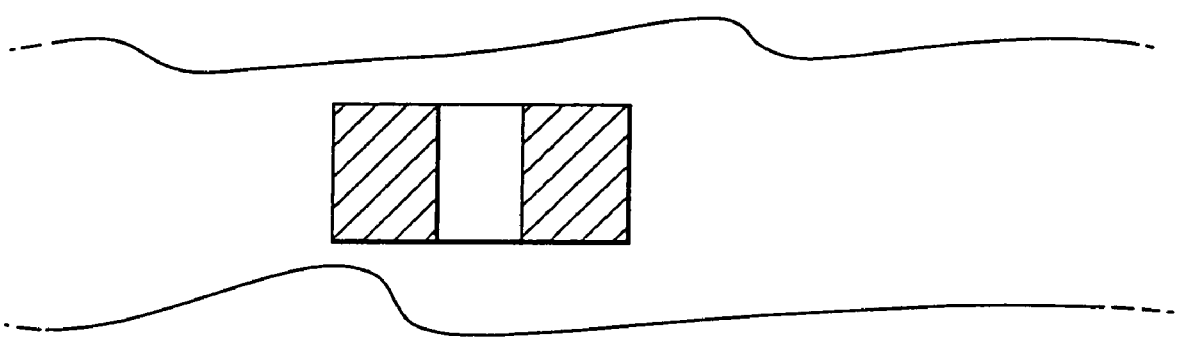

Substrate 12, shown in greater detail in FIG. 2, is in the form of a laminated sheet or tape. Two layers 21a and 21b of metallic material, such as copper (or aluminium), sandwich a flexible substrate 12 comprises an etchable polymer such as polyethylene (tri-thalmate) (PET). As substrate 12 is flexible it is delivered on rolls or drums 22a. As substrate 12 is flexible, after it has been connected with components the substrate, including components, can be wound onto another roll 22b.

In the present embodiment the thickness of the substrate is 190 microns, although thicknesses between 100 microns and 600 microns have been employed. Ideally if a silicon chip is to be inserted, it will be ground down from the back to give a similar thickness to that of the substrate. Alternatively, a substrate thickness is chosen according to the thickness of the semiconductor chip.

A non-metallic base material such as PET substrate 12 is clad with a metal material on at least one of its surfaces by laminating a sheet of the metal material, using an adhesive bonding agent or by catalysing the base material and plating a layer of metal which coats the base material in uniform thickness.

Substrate 12 may be introduced in a part finished or 'raw' form. If it is raw, the substrate needs to be treated. This is achieved by firstly coating the substrate with a photoresist. This may be applied as a curtain coat by thin uniform spraying, or using other known techniques.

Conductor tracks, interconnects and die bonding sites are then photo-imaged on both surfaces. This is a routine step in printed wiring board processing.

Using the photo image and etch procedure, a circuit pattern is formed on the metal clad surface of the substrate. The circuit pattern has attachment locations 52 which correspond to bond pad dimensions and locations of a semiconductor component (not shown) to be inserted into the cavity defined on the substrate and connected to interconnects.

On the side of the material opposing the circuit pattern, at an area corresponding to the dimensions of the semiconductor component to be mounted, there are located corresponding bonding pads of the circuit pattern.

Once a region from the upper material has been removed, laser ablation removes the underlying polymer layer defining the substrate. Although mention has been made of PET as the polymer used in the substrate, a variety of other materials are suitable for use. For example, liquid crystal polymers (LCPs), polyamide, PEN/polyethylene napa thalmate, poly vinyl chloride and Mylar™ can be incorporated into or from the substrate. Another suitable material for fabricating chip carriers is Thermount™—available from Dupont—a random strand aramid reinforced laminate material, although this material has poor edge profiling properties it is a very easy material to ablate.

Laser ablation occurs at extremely high rates, typically between 300 to 800 pulses per second. Micro-processor 20 varies the rate and duration of pulses from laser 14. This combination permits the vaporisation rate to be controlled and administered for the specific properties of the substrate material. The result is that ablation occurs at a precise X and Y location over a known area to a predetermined depth for a given array of M rows of cavities by N columns of cavities, defined over a specific area.

Events in the production process are modular. The substrate is firstly coated, then photo-imaged. Etching and stripping then occur. Laser ablation of the opening or cavity is then performed. The next step is plasma and/or wet chemical cleaning using for example a potassium permanganate solution. After this cleaning step, metal is deposited on the mechanical tab structures such (or contacts) just formed. This is achieved by immersion alloy deposition from solution. This is an electrodeless process, although electroplating could be used as an alternative. The metal alloy chosen must be compatible with the application or bonding method chosen. Typical materials include tin, gold or silver based materials.

During the laser ablation step, material ablated from the cavity can redeposit on other parts of the substrate. Such deposits are usually removed during the plasma and/or wet cleaning step. However, if the material being ablated is polyimide removal can be difficult. To aid removal, an optional sacrificial layer can be deposited on the substrate surface or surfaces prior to the laser ablation step. The sacrificial layer can be photoresist for example. After ablation this layer can be easily removed by plasma and/or wet cleaning, and any redeposited material is removed at the same time.

The PCBs are then cut to shape and finished. This contouring step can be achieved by CNC routing, die punching, or YAG laser contouring Electrodes are pre-defined by the etching process. A series of digitated connectors, spaced one from another and arranged to be in register with contacts of the component or die to be inserted into the cavity or die are formed by a metal etch process before laser ablation of the dielectric. As an alternative, the electrodes can be laser etched in the metal layer at the base of the cavity after the dielectric material has been ablated. Alternatively, modifications to a pre-etched pattern in this layer can be made with the laser after the cavity has been formed (for example by removing tabs to free the end of an elongate structure).

Figure 3A:
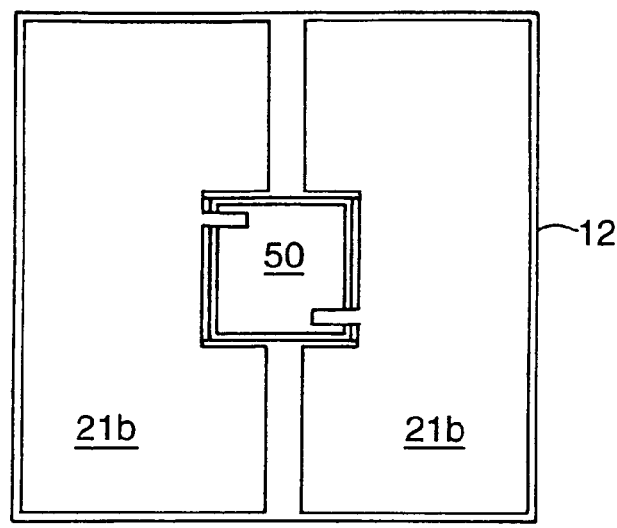
FIGS. 3a to 3c are plan views showing examples of interconnects.
Figure 3B:
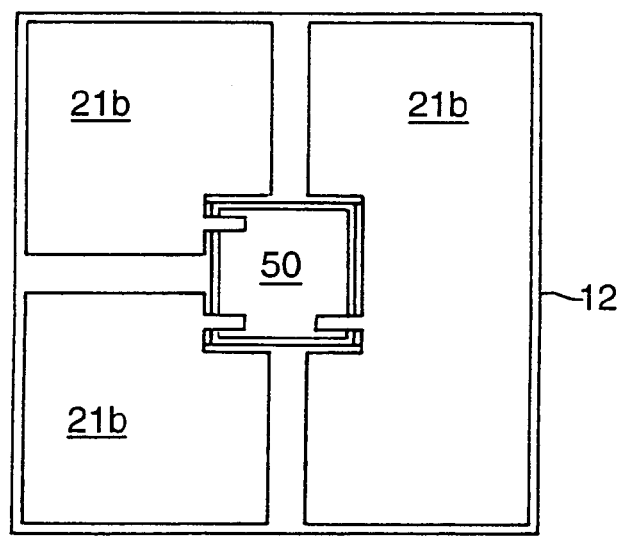
Figure 3C:
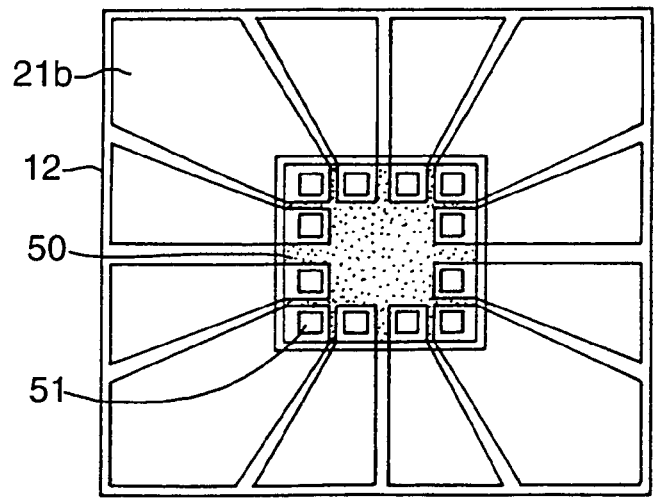

The perforated substrate with contacts defined on one surface acts as a shelved recess for receiving electronic components (50). The simplest embodiment is an embodiment with one or two contacts, suitable for receiving, for example, capacitors (FIG. 3a). Transistors require a third contact to be formed and a sketch of such is shown in FIG. 3b. More complex devices, such as integrated circuits (ICs), Read Only Memory (ROM), Random Access Memory (RAM) or micro-processors require many contacts (51). An example is shown in FIG. 3c.

The elongate metal bond leads or tabs which form the electrical contacts perform a dual function. Firstly, they act as electrical pathways to/from components. Secondly, they retain components at least during the fabrication process, due to their mechanical properties. For example, devices can be compression mounted, where insertion of the device causes the projecting tabs to fold, creating resilient clip structures which keep the device in place. It has been found that silver coated contact tabs are particularly advantageous in this application.

Registration of each etched region, on each surface is crucial. However, it will be appreciated that a certain degree of tolerance is permitted and die locations may be offset so as to provide for a suitable mechanical recess, capable of receiving and holding electrical components.

Components can be bonded to the electrodes projecting adjacent the cavity by for example ultrasonic bonding and/or pressure bonding. Alternatively shrink-wrap films can be adapted to urge a component against the electrodes, or an adhesive tape or tab may be used.

The invention may be used to create an array of cavities. An advantage of this arrangement is that a plurality of devices may be produced on a single substrate.

The substrate may be flexible, and capable of being wound or folded so as to ease transportation by reducing its bulk. For example, either prior to and/or after fabrication, the substrate may be stored on a spool.

Components may be introduced into previously formed cavities by any known technique, such as for example a pick-and-place machine, by air jet (vacuum) or by hand. An arrangement whereby a reduced air pressure is created at one surface is particularly convenient. The pressure difference draws electronic components into each cavity, so that the component (such as a semiconductor chip or die) may be bonded to the substrate.

If the present invention is used to make chip carrier circuitry, individual chip carriers may be die cut, routed, or sawn from a relatively large sheet or tape of the substrate.

A particularly advantageous feature of the invention is that it facilitates a flatter chip carrier profile than is normally achievable. Typically thickness of a chip carrier is fabricated in accordance with the invention is 17 micron greater than the die thickness. However, by using the present invention, because a portion of substrate is removed to accept the component, the resultant carrier profile is thinner than has been previously achievable.

Many different types of electrical and electronic components can be placed into the substrate opening or cavity. These include resistors, capacitors, inductors, transistors, integrated circuits, tuners, wave-guides, piezoelectric devices, coils and/or heat-sinks. Additionally, or alternatively, each opening or cavity may be adapted to receive an electro-optical device, such as a liquid crystal device or a light emitting diode. In this latter case conductive tracks may be defined on a surface, using a transparent material such as Indium Tin Oxide (ITO).

In the above embodiments, the opening formed by laser ablation has extended all the way through the substrate. As an alternative a blank opening or cavity may be fabricated by stopping the ablation before all the substrate is removed. This technique is useful for making cavities in multilayer PCBs.

Multilayer PCBs have prepreg dielectric layers, typically 70 microns thick, interleaved with conductive metal layers. The laser ablation process can be used to remove such material to expose bond pads in a subsurface metal layer. A flip chip die with solder bumps can then be placed on top of the bond pads, so that when the assembly is heated the solder flows and bonds the chip in place. An advantage of this technique is that the subsurface layers of the multilayer PCB can be used for signal input and output to the chip, which shortens the signal conductor length and reduces propagation delays.

In addition to the formation of openings or cavities for mounting semiconductor or other devices, it is also possible to ablate via holes through the PCB at the same time. In a preferred embodiment, shown in FIG. 4, an elongate flap or tab of metal (30) is left at the bottom of the via hole (31). This flap or tab is longer than the depth of the via hole, and can optionally have an end shaped to form a serrated edge (32) or a barb or spike. This flap or tab can be urged into the via by blowing a gas or liquid towards the via, or by pushing using a pin or similar solid tool. The part of the flap or tab projecting though the other side of the via hole can then be crimped to a conductive track at the other side of the PCB, forming a through contact without the usual plating steps. In FIG. 4 the serrated edges are shown engaging with a second opening or cavity (33) in the substrate, which can be formed by laser ablation or otherwise. This technique may also be advantageous in conventional PCB manufacture, when openings or cavities for receiving electronic devices are not cut in the substrate.

Although in the above embodiment the laser ablation occurs through a patterned metal layer carried by the substrate, it is possible to use a separate metal sheet with corresponding holes cut therein as a mask positioned adjacent the substrate as an alternative.

In the above examples, the laser ablation step exposed elongate contacts which projected into the resulting cavity. Such elongate metal members need not be electrical contacts, however—they can form mechanical structures such as for example for pressure switches.

The invention has been described by way of examples only and variation may be made to the embodiments described, for example by using equivalents not specifically disclosed.

Finally, the document from which this application claims priority, especially the Figures, is incorporated herein by reference.

What is claimed is:

1. A method of making an electronic device comprising the steps of
    1. providing a laminated dielectric substrate of predetermined thickness having a first and second side and being comprised of a dielectric substrate material laminated with a conductive foil of a prescribed thickness on both the first and second sides;
    2. creating a conductive circuit on the second side of the laminated dielectric substrate by selectively removing portions of the conductive foil on the second side of the laminated dielectric substrate to leave remaining a conductive foil circuit projecting in part into the perimeter of a preselected volume of the dielectric substrate material at a prescribed location within the perimeter;
    3. removing conductive foil from the first side of the laminated dielectric substrate within the perimeter of the preselected volume to expose the dielectric substrate material completely within said perimeter;
    4. removing entirely the volume of the dielectric substrate material within said perimeter to create a void in the dielectric substrate material without damaging the part of the conductive circuit projecting into the perimeter of the void;
    5. inserting into the void of the dielectric substrate material, from the first side of the laminated dielectric substrate, an electronic component having a thickness not greater than the preselected thickness of the laminated dielectric substrate and having at least one contact on the surface of the electronic component first inserted into the void, the at least one contact corresponding in position to the part of said conductive circuit that projects into the perimeter of the void so that when fully inserted, the contact on the electronic component registers with and contacts said projecting part of the conductive circuit; and
    6. bonding together the contact on the electronic component and the projecting part of the conductive circuit to hold the electronic component in the void of the dielectric substrate material.

2. A method of making an electronic device according to claim 1 wherein step 4 is carried out by a laser.

3. A method of making an electronic device according to claim 2 wherein the laminated dielectric substrate is moved past the laser.

4. A method of making an electronic device according to claim 1 wherein the laser is a $CO_2$ laser.

5. A method of making an electronic device according to claim 1 wherein step 2 is carried out using artwork.

6. A method of making an electronic device according to claim 1 wherein the conductive foil is one of copper and aluminum.

7. A method of making an electronic device according to claim 6 wherein the conductive foil is copper.

8. A method of making an electronic device according to claim 1 wherein the dielectric material is a polymer.

9. A method of making an electronic device according to claim 8 wherein the polymer is one of PET, liquid crystal polymers, polyamide, PEN, polyvinyl chloride, Mylar, and Thermount, a random strand aramid.

10. A method of making an electronic device according to claim 1 wherein the polymer is PET.

11. A method of making an electronic device according to claim 1 wherein thickness of the substrate is less than 200 microns.

12. A method of making an electronic device according to claim 1 wherein step 2 includes creating conductor tracks.

13. A method of making an electronic device according to claim 1 wherein step 2 creates a plurality of conductive tabs projecting into the perimeter of the void.

14. A method of making an electronic device according to claim 1 wherein the perimeters of the void and electronic component register.

15. A method of making an electronic device according to claim 3 wherein the laser is pulsed at a relatively high rate.

16. A method of making an electronic device according to claim 15 wherein the rate is from about 300 to about 800 pulses per second.

17. A method of making an electronic device according to claim 1 wherein step 4 is followed by plasma or wet chemical cleaning.

18. A method of making an electronic device according to claim 1 wherein the projecting part of the circuit is used as a pressure switch.

19. A method of making an electronic device according to claim 1 wherein step 4 is carried out to create a plurality of spaced voids.

20. A method of making an electronic device according to claim 19 wherein the spaced voids are arranged in an array.

21. A method of making an electronic device according to claim 1 wherein step 4 is followed by deposition of one of tin, silver and gold on the part of the circuit projecting into the perimeter of the void.

22. A method of making an electronic device according to claim 21 wherein the deposition covers all exposed portions of the laminated dielectric substrate.

23. A method of making an electronic device according to claim 1 wherein the electronic component is a die.

24. A method of making an electronic device according to claim 1 wherein the electronic component is a semiconductor chip.

25. A method of making an electronic device according to claim 24 wherein the semiconductor chip is one of an IC, ROM, RAM and microprocessor.

26. A method of making an electronic device according to claim 1 wherein step 6 is carried out by one of ultrasonic bonding and pressure bonding.

27. A method of making an electronic device according to claim 1 wherein the laminated dielectric substrate is flexible.

28. A method of making an electronic device according to claim 27 wherein step 6 is followed by winding the laminated dielectric substrate on a spool.

29. A method of making an electronic device according to claim 1 wherein step 5 is carried out using one of a pick-and-place machine, an air jet and a vacuum.

30. A method of making an electronic device according to claim 1 wherein the laminated dielectric substrate is one of a tape and a sheet.

31. A method of making an electronic device according to claim 1 wherein step 6 is followed by repeating steps 1 to 6 one or more times so that a plurality of separate electronic devices are produced, and then stacking the separate substrates to create a multilevel structure.

32. A method of making an electronic device according to claim 1 wherein the electronic component is one of a resistor, a capacitor, an inductor, a diode, a transistor, an IC, a tuner, a wave guide, a piezoelectric device, a coil, a heat sink, an electro-optical device.

33. A method of making an electronic device according to claim 32 wherein the electronic component is an LED.

34. A method of making an electronic device according to claim 33 wherein conductive tracks are created on the laminated dielectric substrate that interconnect the LED.

35. A method of making an electronic device according to claim 34 wherein the tracks are transparent and composed of indium tin oxide.

36. A method of making an electronic device according to claim 31 wherein a preselected portion of an exposed conductive foil is removed to expose the underlying dielectric substrate material, creating a void in the underlying material exposed and exposing an embedded conductive foil, inserting a flip chip die into the void to contact the exposed embedded conductive foil, and bonding the flip chip die thereto.

37. A method of making an electronic device according to claim 36 wherein the flip chip die includes solder bumps to effect bonding.

\* \* \* \* \*